ELECTRONIC SWITCHING OF ANALOG CARRIER SIGNALS

Filed July 1, 1960 2 Sheets-Sheet 1

*INVENTOR.*
ARTHUR S. ROBINSON
BY Charles J. Worth
AGENT

Jan. 12, 1965 A. S. ROBINSON 3,165,639

ELECTRONIC SWITCHING OF ANALOG CARRIER SIGNALS

Filed July 1, 1960 2 Sheets-Sheet 2

INVENTOR.
ARTHUR S. ROBINSON
BY Charles J. Worth
AGENT 3,165,639
Patented Jan. 12, 1965

3,165,639

ELECTRONIC SWITCHING OF ANALOG CARRIER SIGNALS

Arthur S. Robinson, Allendale, N.J., assignor to The Bendix Corporation, Teterboro, N.J., a corporation of Delaware Filed July 1, 1960, Ser. No. 40,231
11 Claims. (Cl. 307—88.5)

Figure 1:
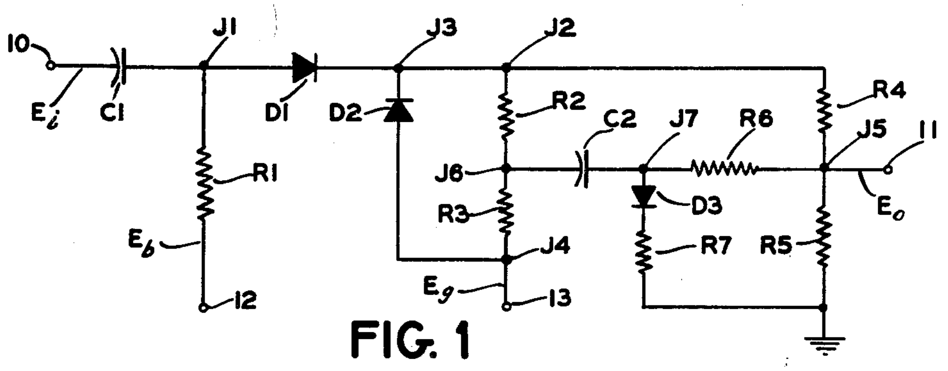

This invention relates to electronic gates having a semiconductor diode to control gating of analog carrier or alternating voltage signals.

When considering a diode for electronic gating, its polarity sensitive characteristics are used to obtain desirable high "on-off" transmission ratios with rapid switching response. There are various ways to control the state of a diode for gating an alternating voltage signal. It has been found to be advantageous to continuously apply a positive direct reference voltage of fixed magnitude, through a resistor, to the input of a positive-transmitting diode. The reference voltage provides a current level through the diode that exceeds the maximum amplitude of the alternating current signals to be transmitted by the diode, to present the desired alternating voltage signals at the gate output. The negative going half waves of the signals when superimposed on the reference current appear as variable positive current and are transmitted by the diode, which appears as a low impedance element in the circuit, when biased for operation along the linear portion of its forward characteristic.

To back bias the diode and block transmission of the signals, a positive direct control voltage is applied to the output of the diode that exceeds the combined magnitude of the reference voltage and the maximum amplitude of the alternating voltage input signals. Even so, it has been found that small spurious signals, due to the finite back impedance of a diode, tend to appear at the gate output when the gate is "off" or not transmitting. By reference to curves illustrating transfer characteristics of diodes, when direct voltage is applied to back bias a diode, its transfer characteristic curve does not extend along the zero current transfer level. Of course, while this would be preferable, the curve actually extends along a shallow slope, the degree of slope being determined by the specific charted diode. When the diode is in this operating region, alternating voltage at the diode input causes small spurious currents to flow through the load, which in many instances cannot be tolerated.

Gating alternating voltage signals with direct voltage as described, usually requires a capacitor or other means to block the direct voltage from the input of the gate. Although the inclusion of the capacitor provides a necessary function, it is attended by creation of a problem of switching transients. When the gate goes from "on to off," switching transients are negligible and the switching response is substantially instantaneous. During the "off" period of the gate, the direct voltage applied to the diode input tends to charge the capacitor an amount approaching the maximum magnitude of the voltage. When the gate goes from "off to on" or when the diode starts to transmit, the charged capacitor is included in the active circuitry and its voltage level decays exponentially over a period of time during which the biasing voltage attains a quiescent level or a steady state value that delays the switching response.

An object of this invention is to provide an electronic gate with a semiconductor element for transmitting analog carrier signals having means to eliminate spurious signals from the gate output when the gate is "off" or not transmitting.

Another object of this invention is to provide an electronic gate with a semiconductor element for transmitting analog signals having means to eliminate switching transients.

Another object of this invention is to provide a single diode gate for transmitting alternating voltage signals having high signal rejection when the gate is nonconducting and compensating means for switching transients.

And another object of this invention is to provide an electronic gate for transmitting alternating voltage signals at substantially unity gains with rapid switching response.

This invention contemplates a compensating network to improve gating characteristics of a biased diode gate for transmitting alternating voltage signals having a resistor connecting a source of direct voltage to current bias the diode to transmit and a capacitor for blocking the direct voltage from the gate input. The gate has means connected to a source of direct voltage to provide control voltage to the diode which varies between a predetermined level to back bias the diode and block signal transmission causing the capacitor to be charged by direct voltage connected to the gate by the resistor, and another level during signal transmission. The compensating network includes means for clamping the control voltage to the gate output to suppress spurious signals at the gate output when the signals are blocked, and a capacitor connected in parallel with the clamping means and charged by the control voltage when the signals are blocked for simultaneously discharging with and in opposition to the capacitor blocking direct voltage from the gate input to eliminate switching transients when the gate is switched from "off to on."

The foregoing and other objects and advantages of the invention will appear more fully hereinafter from a consideration of the detailed description which follows, taken together with the accompanying drawings wherein three embodiments of the invention are illustrated by way of example. It is to be expressly understood, however, that the drawings are for illustration purposes only and are not to be construed as defining the limits of the invention.

FIGURE 1 is a circuit diagram of a novel single diode gate constructed according to the invention having a compensating network for improving gating characteristics.

Figures 2, 3:
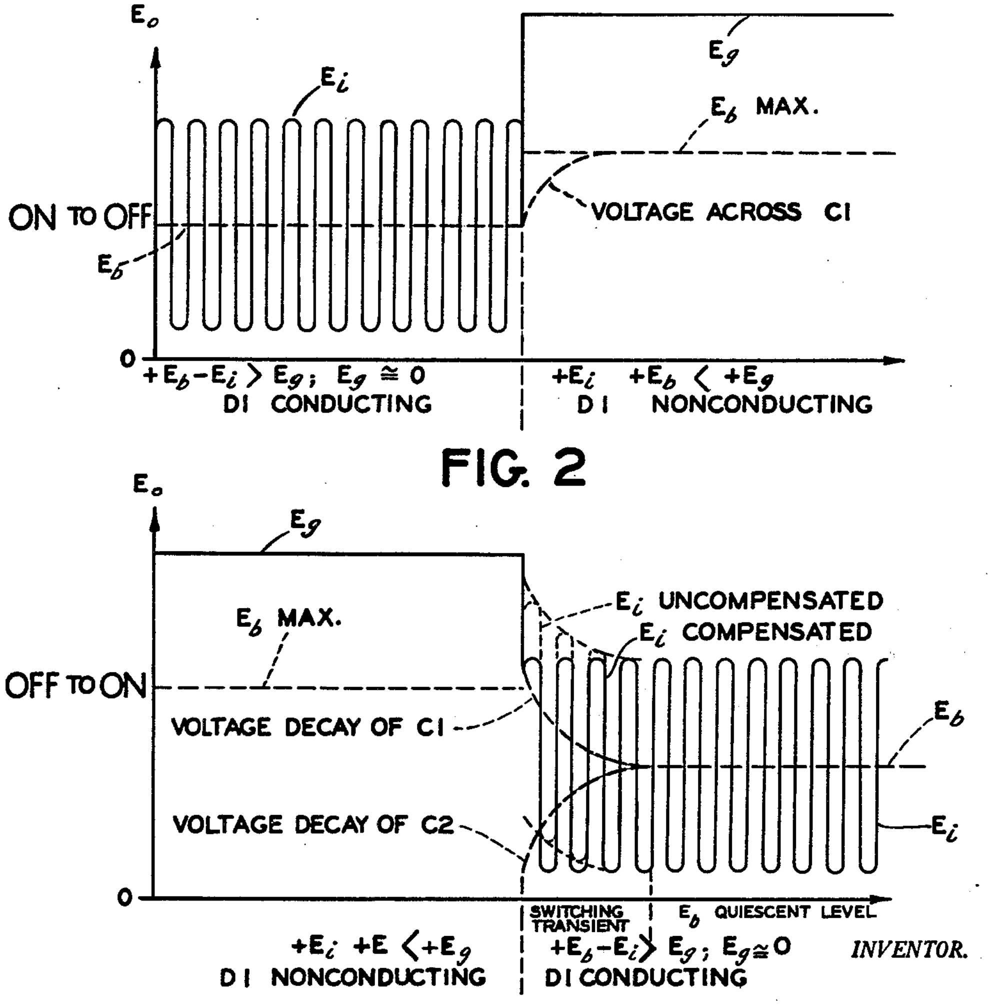

FIGURE 2 graphically shows the character of alternating voltage signals, and reference and control voltage levels of the novel gate of FIGURE 1 when it goes from "on to off."

Figure 4:
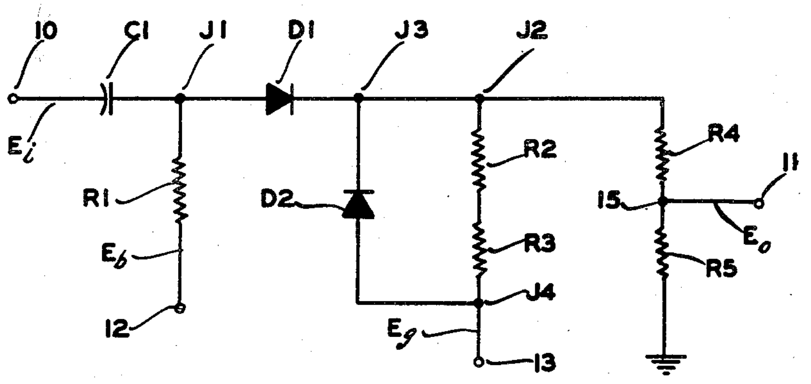
Figure 5:
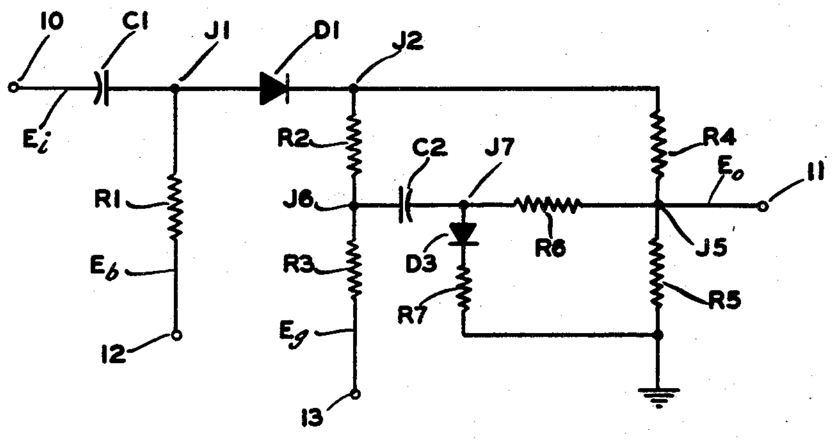

FIGURE 3 is a graphic showing similar to FIGURE 2 when the novel gate of FIGURE 1 goes from "off to on," and, FIGURES 4 and 5 are circuit diagrams of modifications of the gate of FIGURE 1 constructed according to the invention.

The diodes D1 and D2 of FIGURE 1 are positive-transmitting elements, and the direct reference and control voltages are discussed as being of positive polarity for convenience. The polarity of the voltages and the diodes may be reversed and the gate will remain operative if the diodes and voltages remain matched. Because a diode appears as a high impedance element when back biased and a low impedance element when forward biased, voltage is considered to block transmission and current is considered when the diode is transmitting. For the following description, it should suffice to say that current transmitted by the diode is a function of the corresponding voltage applied to the diode input, and the associated circuit impedances and resistances.

Referring specifically to FIGURE 1, the gate has an input 10, to receive analog signals $E_1$, connected to the input side of the positive-transmitting diode D1 by a capacitor C1. A source 12 continuously providing the positive direct reference or biasing voltage $E_b$ of fixed magnitude is connected by a resistor R1 to a junction J1 between capacitor C1 and diode D1. The output side of diode D1 is connected to a point of zero potential by series connected resistors R4 and R5, and to an output 11 connected to a junction J5 between resistors R4 and R5. A source 13 of the positive direct back biasing or control voltage $E_g$ is connected by series connected resistors R2 and R3 to a junction J2 between the output side of diode D1 and resistor R4. The diode D2 is connected in parallel with resistors R2 and R3 with its output connected to the output of diode D1 at a junction J3, and with its input connected to voltage source 13 at a junction J4. The diode D2 is part of the compensating network as will be further discussed.

When the gate is transmitting, the control voltage $E_g$ is substantially at zero potential and the biasing voltage $E_b$ is applied to current bias diode D1, appearing as a low impedance element, with the alternating current signals corresponding to voltage signals $E_i$ superimposed thereon. The positive biasing current $E_b$ is of sufficient magnitude that the negative going half waves of the alternating signals never cause diode D1 to cut off. To block transmission of the signals $E_i$, the control or back biasing voltage $E_g$ from source 13 is applied to the output side of diode D1 at a predetermined level exceeding the combined magnitude of biasing voltage $E_b$ and the peak positive amplitude of signals $E_i$. The diode D2 connected between source 13 and the output side of diode D1 clamps the control voltage $E_g$ to gate output 11 to eliminate all spurious signals which may tend to appear at the output 11.

When the control voltage $E_g$ is applied to the output side of the diode D1, the direct voltage level at output 11 rises almost immediately and transmission of the signals $E_i$ is blocked by diode D1, as shown in FIGURE 2. With diode D1 blocked, the magnitude of the biasing voltage $E_b$ rises to its maximum value and tends to charge capacitor C1, also shown in FIGURE 2, until the voltage across the capacitor C1 approaches the maximum value of the biasing voltage $E_b$. Thus, when the gate is "off," the control voltage $E_g$ is applied to the output side of the diode D1 and the maximum value of the biasing voltage $E_b$ is locked to the input side of the gate and charges capacitor C1.

When switching the gate "on," the control voltage $E_g$ is brought to ground potential and when it reduces to the maximum level of biasing voltage $E_b$, the diode D1 starts to conduct. However, the level of the biasing voltage $E_b$ will not immediately reach its quiescent level due to the exponential decay of the voltage level of the charged capacitor C1, as shown in FIGURE 3. To compensate for the exponential decay of the voltage across capacitor C1, an R.C. network portion of the compensating network is included in the gate. The R.C. network is comprised of a capacitor C2 and a resistor R6 connected in series from a junction J6, between resistors R2 and R3, to the junction J5. A diode D3 and a resistor R7 are connected in series from a junction J7, between the capacitor C2 and the resistor R6, to a point of zero potential.

With the inclusion of the R.C. network, when the gate is switched "off," by applying control voltage $E_g$ at a predetermined magnitude to diode D1 to block transmission of signals $E_i$, the voltage $E_g$ charges capacitor C2 while the capacitor C1 is simultaneously charged by the biasing voltage $E_b$. The side of the charged capacitor C2 connected to the junction J6 is positive and its other side is negative so when the gate is turned on, the voltage level across the capacitor C2 will decay across the resistor R6 simultaneously with and in opposition to the decay of the voltage level of the capacitor C1, as shown in FIGURE 3. With the circuit designed to provide concurrent decay of the voltage levels of the capacitors C1 and C2, the reference voltage $E_b$ will arrive at its quiescent level with substantially no time delay which was originally caused by the decay of the voltage level of the uncompensated charged capacitor C1.

Where circuit design permits, the resistor R2, connected to junctions J2 and J6 may be eliminated from the gate to insure complete discharge of capacitor C2 when the gate is switched from "off to on." The gate of FIGURE 1 has improved gating characteristics due to the compensating network comprised of the diode D2 which clamps control voltage $E_g$ to gate output 11 when the signals are blocked to suppress spurious signals, and the R.C. network which compensates for switching transients caused by the charged capacitor C1 when the gate is switched from "off to on."

In some instances, a circuit embodying the gate may be capable of tolerating delayed switching response or spurious signals. In these instances, the gate of FIGURE 1 may be modified as shown in FIGURES 4 or 5 in which the elements of the modified gates are identified by the same numbers applied to similar elements of the gate of FIGURE 1. The R.C. network of the compensating means of the gate of FIGURE 1 is not included in the gate of FIGURE 4 and therefore although spurious signals are eliminated, switching transients may still be present. When spurious signals can be tolerated but rapid switching response is required, the modified gate of FIGURE 5 may be used, in which the clamping diode D2 is not included.

Although but three embodiments of the invention have been illustrated and described in detail, it is to be expressly understood the invention is not limited thereto. Various changes may also be made in the design and arrangement of the parts without departing from the spirit and scope of the invention as the same will now be understood by those skilled in the art.

I claim:

1. An electronic gate having an input adapted to receive alternating voltage signals and an output, means connecting the input to the output for transmitting signals when forward biased and for blocking signals when back biased, a source of direct reference voltage of fixed magnitude connected to the connecting means providing voltage to forward current bias the connecting means, means connected between the input of the gate and the voltage source for isolating the input from direct reference voltage and being charged by the direct reference voltage when the signals are blocked, means connected to the connecting means providing direct control voltage varying between a predetermined level to back bias the connecting means and another level during signal transmission, and a compensating network clamping the control voltage to the output of the gate to suppress spurious signals at the output of the gate when the signals are blocked and having means charged by the control voltage when the signals are blocked for simultaneously discharging with and in opposition to the isolating means to eliminate switching transients when the control voltage goes from the predetermined level to the other level and the gate starts to transmit.

2. The gate according to claim 1 in which the compensating network includes a diode for clamping the control voltage to the output of the gate when signal transmission is blocked.

3. The gate according to claim 2 in which the connecting and clamping means are diodes connected to the output of the gate so that transmission by one of the diodes back biases the other.

4. An electronic gate having an input adapted to receive alternating voltage signals and an output, a gating diode connecting the input to the output for transmitting signals when forward biased and for blocking signals when back biased, a capacitor connected between the input of the gate and the gating diode to isolate the input from direct voltage and being charged thereby when the signals are blocked, means for connecting direct voltage across the gating diode to provide a bias having a swing between a level to forward current bias and another level to back bias the diode to control signal transmission, another diode connecting the output of the gate to the means providing direct voltage to clamp direct voltage to the output of the gate for suppressing spurious signals when the gating diode blocks signal transmission, and a capacitor connected to the clamping diode and charged by the direct voltage for simultaneously discharging with and in opposition to the capacitor connected to the input to eliminate switching transients when the gate starts to transmit.

5. An electronic gate having an input adapted to receive alternating voltage signals and an output, means connecting the input to the output for transmitting signals when forward biased and for blocking signals when back biased, a capacitor connected in series between the input and the connecting means to isolate the input from direct voltage, a source of direct reference voltage connected to the connecting means providing voltage to forward current bias the connecting means that charges the capacitor when the signals are blocked, means providing direct control voltage varying between a predetermined level to back bias the connecting means and another level during signal transmission, and a compensating network connecting the output of the gate to the means providing the control voltage and having a capacitor charged by the control voltage when the signals are blocked for simultaneously discharging with and in opposition to the capacitor connected to the input of the gate to eliminate switching transients when the control voltage goes from the predetermined level to the other level and the gate starts to transmit.

6. The gate according to claim 5 in which the connecting means is a diode having low impedance characteristics when forward current biased to transmit signals and high impedance characteristics when back biased to block signals.

7. An electronic gate having an input adapted to receive alternating voltage signals and an output, means connecting the input to the output for transmitting the signals when forward biased and for blocking the signals when back biased, means connected to the connecting means and providing direct control voltage varying between a predetermined high level of one polarity to back bias the connecting means to block the signals and another low level of the same polarity to provide for signal connecting means to block the signals and another low level to provide for signal transmission, and means for clamping the control voltage to the output to suppress spurious signals at the output when the signals are blocked.

8. The gate according to claim 7 in which the connecting and clamping means are diodes connected to the gate output and the diodes are connected so that one diode transmits when the other diode is blocked.

9. The gate according to claim 7 in which the connecting and clamping means are diodes and the diodes are connected to the output of the gate so that transmission by one of the diodes back biases the other.

10. A compensating network for improving the characteristics of a gate with direct voltage forward current biased means transmitting signals from the gate input to the gate output having means for isolating the input from direct voltage that is charged by the direct voltage when transmission of the signals is blocked and means for providing direct control voltage to back bias the transmitting means for blocking signal transmission, comprising means for clamping the control voltage to the gate output to suppress spurious signals when signal transmission is blocked, and an R.C. network having means connected in parallel with the clamping means that is charged by the control voltage when signal transmission is blocked for simultaneously discharging with and in opposition to the isolating means to eliminate switching transients when signal transmission starts.

11. The network according to claim 10 in which the clamping means is a diode that is forward biased by the control voltage and the means in the R.C. circuit charged by the control voltage is a capacitor.

References Cited in the file of this patent

UNITED STATES PATENTS

| | | |
|---|---|---|
| 2,535,912 | Frank et al. | Dec. 26, 1950 |
| 2,583,146 | Jacob | Jan. 22, 1952 |
| 2,657,318 | Rock | Oct. 27, 1953 |
| 2,812,451 | Curtis | Nov. 5, 1957 |